United States Patent
Yang et al.

(10) Patent No.: US 12,206,001 B2
(45) Date of Patent: Jan. 21, 2025

(54) FinFET SEMICONDUCTOR DEVICE

(71) Applicant: QUALCOMM Incorporated, San Diego, CA (US)

(72) Inventors: Bin Yang, San Diego, CA (US); Haining Yang, San Diego, CA (US); Xia Li, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/526,756

(22) Filed: Jul. 30, 2019

(65) Prior Publication Data
US 2021/0036120 A1   Feb. 4, 2021

(51) Int. Cl.
H01L 29/423 (2006.01)
H01L 21/762 (2006.01)
H01L 21/8234 (2006.01)
H01L 27/088 (2006.01)

(52) U.S. Cl.
CPC .. *H01L 29/42376* (2013.01); *H01L 21/76224* (2013.01); *H01L 21/823431* (2013.01); *H01L 21/823456* (2013.01); *H01L 27/0886* (2013.01)

(58) Field of Classification Search
CPC ............. G06F 30/394; H01L 27/11807; H01L 23/485; H01L 21/76895; H01L 27/0207; H01L 23/481; H01L 23/482
See application file for complete search history.

(56) References Cited

U.S. PATENT DOCUMENTS

| | | | |
|---|---|---|---|
| 6,180,530 B1 * | 1/2001 | Liaw | H01L 21/76897 257/E21.507 |
| 8,658,524 B2 | 2/2014 | Herberholz et al. | |
| 9,991,268 B1 | 6/2018 | Liaw | |
| 10,553,707 B1 * | 2/2020 | Shen | H01L 29/785 |
| 2001/0020718 A1 | 9/2001 | Takahashi et al. | |
| 2004/0169207 A1 | 9/2004 | Park et al. | |
| 2005/0020015 A1 | 1/2005 | Mathew et al. | |
| 2005/0215002 A1 | 9/2005 | Molette | |
| 2008/0237731 A1 * | 10/2008 | Kishiro | H01L 27/1203 257/370 |
| 2010/0025767 A1 * | 2/2010 | Inaba | H01L 29/785 257/365 |
| 2010/0102389 A1 * | 4/2010 | Muller | H01L 29/7855 257/E29.264 |

(Continued)

FOREIGN PATENT DOCUMENTS

| | | |
|---|---|---|
| CN | 102610642 A | 7/2012 |
| CN | 103165661 A | 6/2013 |

(Continued)

OTHER PUBLICATIONS

International Search Report and Written Opinion—PCT/US2020/070089—ISA/EPO—Sep. 2, 2020.

(Continued)

*Primary Examiner* — Brian Turner
(74) *Attorney, Agent, or Firm* — Muncy, Geissler, Olds & Lowe, P.C.

(57) ABSTRACT

A semiconductor device is disclosed that includes a plurality of fins on a substrate. A long channel gate is disposed over a first portion of the plurality of fins. A gate contact is provided having an extended portion that extends into an active area from a gate contact base outside the active area.

17 Claims, 10 Drawing Sheets

(56) References Cited

U.S. PATENT DOCUMENTS

| | | | |
|---|---|---|---|
| 2011/0140203 A1* | 6/2011 | Hou | H01L 21/823871 |
| | | | 257/E27.014 |
| 2011/0147842 A1 | 6/2011 | Cappellani et al. | |
| 2011/0221009 A1 | 9/2011 | Chuang et al. | |
| 2012/0001271 A1* | 1/2012 | Chae | H01L 27/088 |
| | | | 257/E27.06 |
| 2012/0248512 A1* | 10/2012 | Herberholz | H01L 23/4824 |
| | | | 257/E21.409 |
| 2014/0077305 A1* | 3/2014 | Pethe | H01L 29/66545 |
| | | | 257/368 |
| 2014/0183652 A1* | 7/2014 | Chern | H01L 27/092 |
| | | | 257/369 |
| 2014/0349460 A1* | 11/2014 | Vinet | H01L 29/78618 |
| | | | 438/303 |
| 2015/0056781 A1 | 2/2015 | Akarvardar et al. | |
| 2015/0092371 A1* | 4/2015 | Meinhold | H01L 24/05 |
| | | | 361/767 |
| 2015/0270171 A1 | 9/2015 | Basker et al. | |
| 2015/0333171 A1* | 11/2015 | Hsu | H01L 21/764 |
| | | | 257/347 |
| 2016/0027769 A1* | 1/2016 | Baek | H01L 27/1211 |
| | | | 257/369 |
| 2016/0133522 A1* | 5/2016 | Kang | H01L 21/76816 |
| | | | 438/283 |
| 2016/0155845 A1* | 6/2016 | Breil | H01L 29/66795 |
| | | | 257/347 |
| 2017/0062554 A1* | 3/2017 | Tan | H01L 21/28052 |
| 2017/0170278 A1* | 6/2017 | Peng | H01L 27/0886 |
| 2018/0102364 A1 | 4/2018 | Rastogi et al. | |
| 2018/0175165 A1* | 6/2018 | Lim | H01L 29/66583 |
| 2018/0226323 A1 | 8/2018 | Do et al. | |
| 2019/0157405 A1* | 5/2019 | Huang | H01L 29/41791 |
| 2019/0164813 A1* | 5/2019 | Wang | H01L 21/31055 |
| 2019/0252297 A1* | 8/2019 | Do | G06F 30/394 |
| 2019/0287902 A1* | 9/2019 | Liaw | H01L 23/535 |
| 2019/0311969 A1* | 10/2019 | Liaw | H01L 27/0924 |
| 2020/0168700 A1* | 5/2020 | Song | H01L 29/7846 |
| 2020/0243517 A1* | 7/2020 | Liu | H01L 29/78 |
| 2020/0365698 A1* | 11/2020 | Tsai | H01L 21/76849 |
| 2021/0005749 A1* | 1/2021 | Miller | H01L 21/28114 |

FOREIGN PATENT DOCUMENTS

| | | |
|---|---|---|
| CN | 106057890 A | 10/2016 |
| WO | 2011073635 | 6/2011 |

OTHER PUBLICATIONS

A. Kinoshita "Comprehensive Study on Injection Velocity Enhancement in Dopant-Segregated Schottky Mosfets" Advanced LSI Technology Laboratory, Corporate R&D Center, Toshiba Corporation System LSI Division I, Semiconductor Company, Toshiba Corporation 8, Shinsugita-cho, Isogo-ku, Yokohama 235-8522, Japan.
Taiwan Search Report—TW109119072—TIPO—Dec. 19, 2023.

* cited by examiner

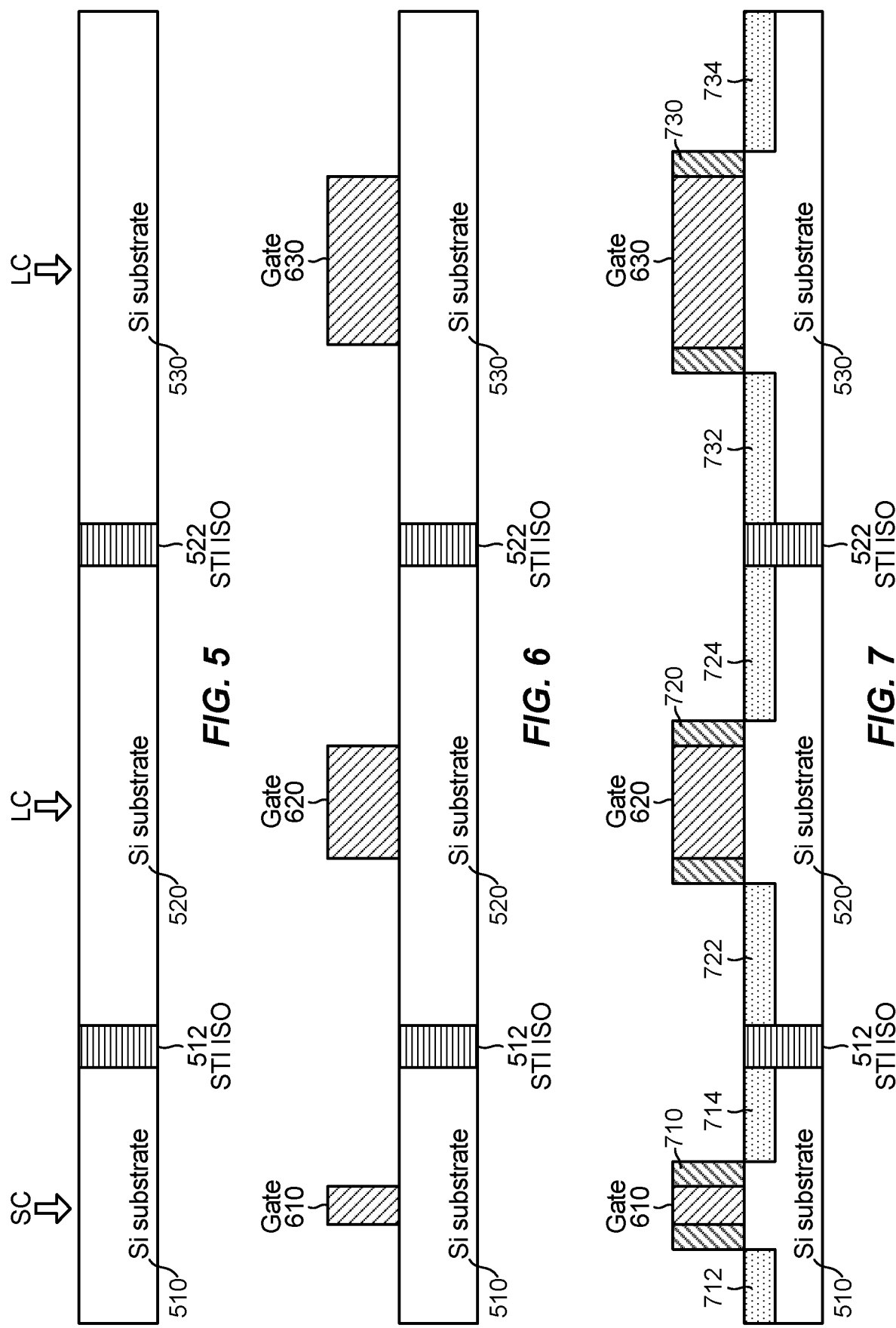

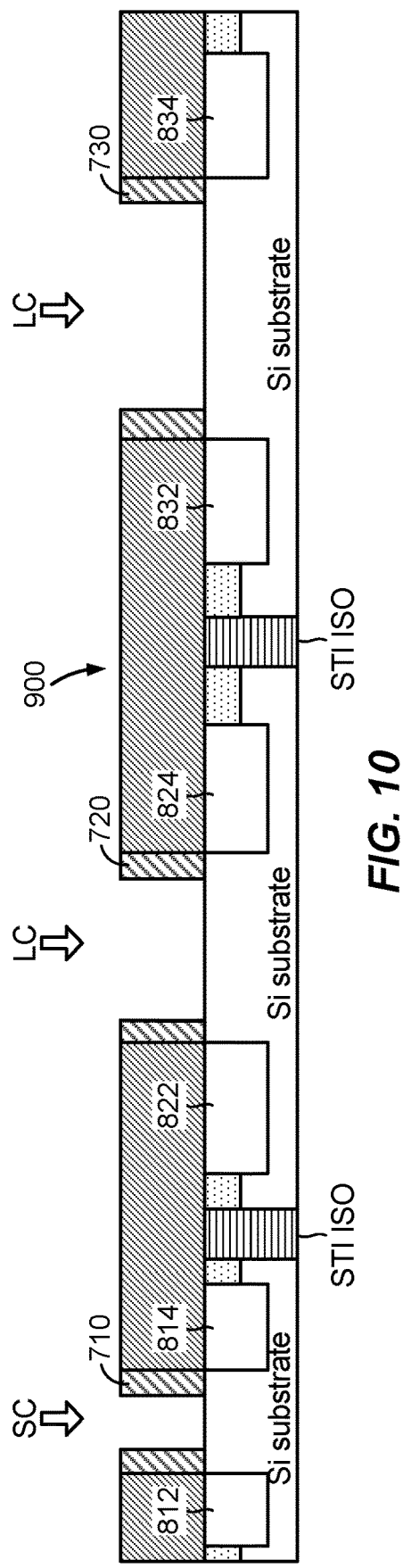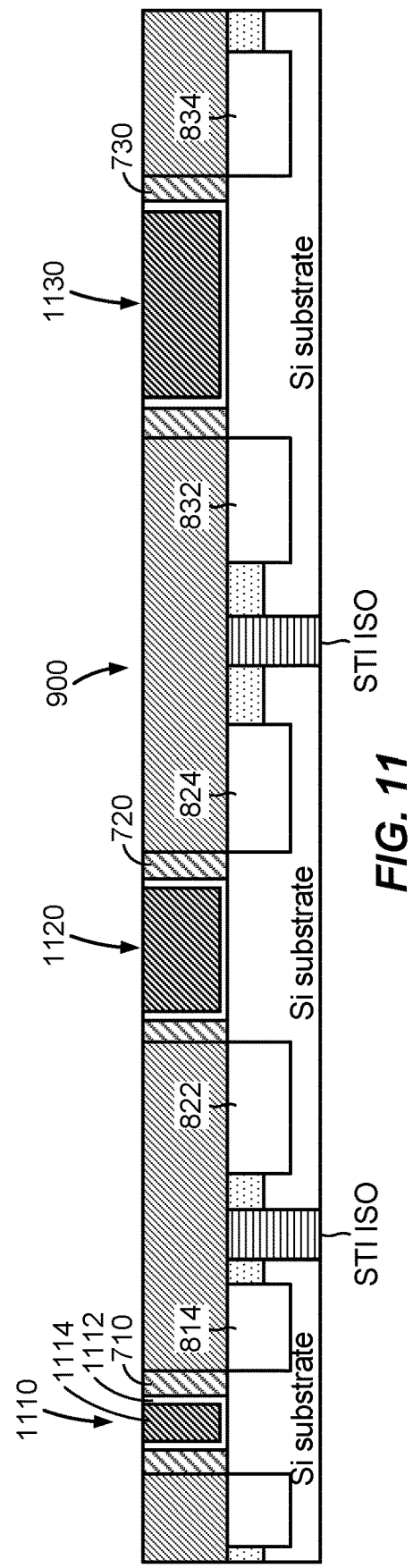

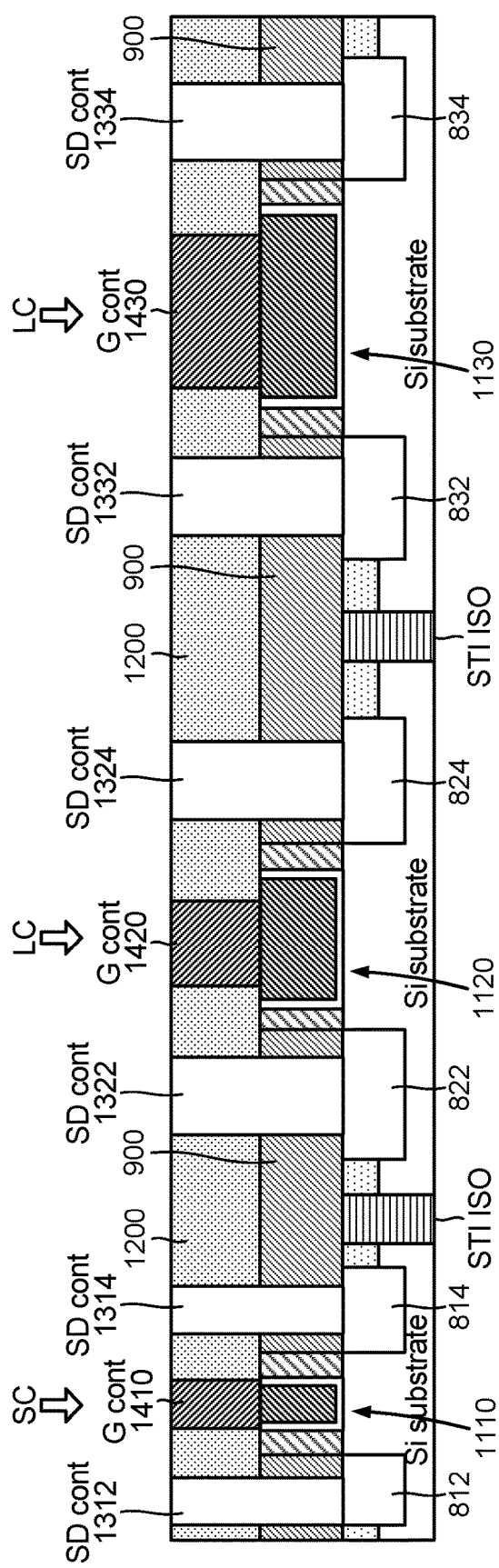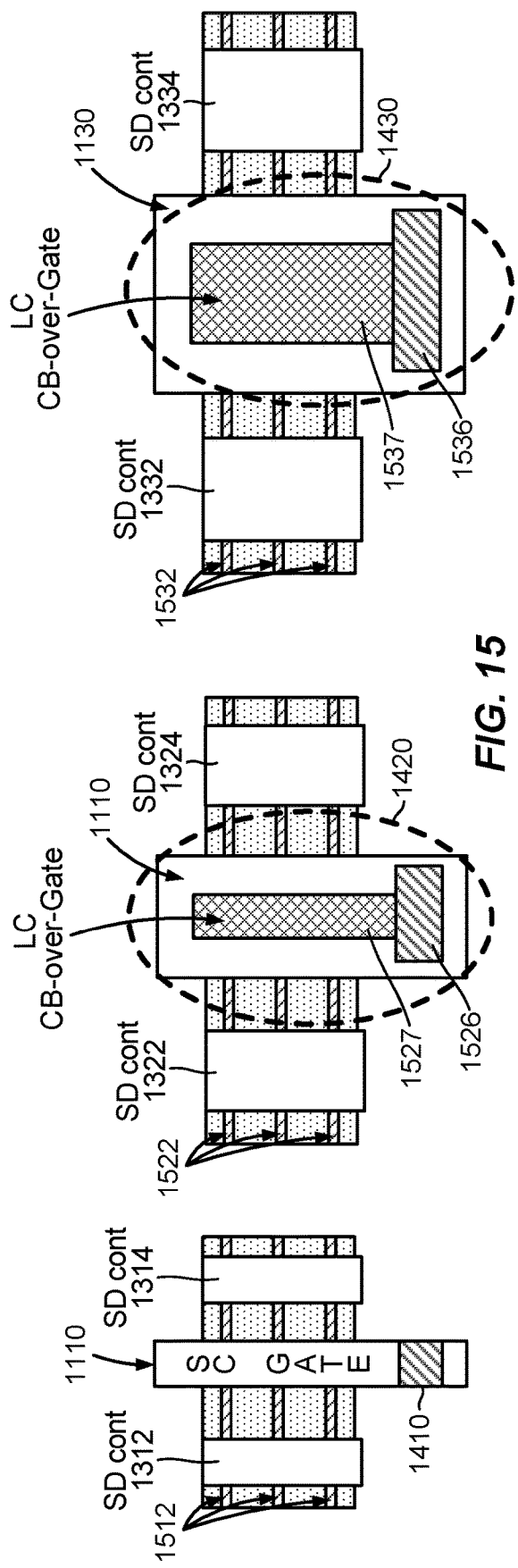
FIG. 14
FIG. 15

FinFET SEMICONDUCTOR DEVICE

TECHNICAL FIELD

The disclosed subject matter relates to semiconductor devices. In some aspects, the disclosed subject matter relates to metal oxide semiconductor field effect transistors (MOSFET) semiconductor devices including fin-type field-effect transistors (FinFET) devices having long channel transistors and short channel transistors.

BACKGROUND

Conventional semiconductor devices, such as MOSFET devices are being reduced in size to increase processing speed, reduce power consumption, reduce device size and/or decrease manufacturing cost. The demand for increased performance and reduced size from semiconductor devices has led to the use of multi-gate devices. These multi-gate devices include multi-gate fin-type field-effect transistors (FinFETs). In a FinFET the channel is formed on a "fin" that extends from the substrate. FinFET devices allow for reducing the gate width of device by providing a gate on the sides and top of the fin including the channel region.

However, reduction in size can lead to negative effects on the semiconductor devices, including MOSFET devices and FinFETs discussed herein. Using conventional techniques semiconductor devices with FinFET long channel transistors and short channel transistors may not be able to achieve their desired threshold voltage (Vt) for each transistor type (long channel or short channel).

Accordingly, it would be advantageous to have a FinFET design that would allow for both short channel transistors and long channel transistors to achieve their desired Vt.

SUMMARY

This summary identifies features of some example aspects and is not an exclusive or exhaustive description of the disclosed subject matter. Whether features or aspects are included in or omitted from this summary is not intended as indicative of relative importance of such features. Additional features and aspects are described and will become apparent to persons skilled in the art upon reading the following detailed description and viewing the drawings that form a part thereof.

An aspect of the disclosure includes a semiconductor device including a plurality of fins on a substrate. A long channel gate is disposed over a first portion of the plurality of fins. A gate contact has a gate contact base and an extended portion that extends into an active area from the gate contact base outside the active area.

Another aspect of the disclosure includes a method of fabricating a semiconductor device. The method includes forming a plurality of fins on a substrate. A long channel gate is disposed over a first portion of the plurality of fins. A gate contact is formed having a gate contact base and an extended portion that extends into an active area from a gate contact base outside the active area.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of examples of one or more aspects of the disclosed subject matter and are provided solely for illustration of the examples and not limitation thereof.

FIG. 5 is an illustration of a portion of a process for forming FinFETs according to one or more aspects of the disclosure.

FIG. 6 is an illustration of a portion of a process for forming FinFETs according to one or more aspects of the disclosure.

FIG. 7 is an illustration of a portion of a process for forming FinFETs according to one or more aspects of the disclosure.

FIG. 10 is an illustration of a portion of a process for forming FinFETs according to one or more aspects of the disclosure.

FIG. 11 is an illustration of a portion of a process for forming FinFETs according to one or more aspects of the disclosure.

FIG. 14 is an illustration of a portion of a process for forming FinFETs according to one or more aspects of the disclosure.

FIG. 15 is an illustration of a portion of a process for forming FinFETs according to one or more aspects of the disclosure.

DETAILED DESCRIPTION

Figure 1:
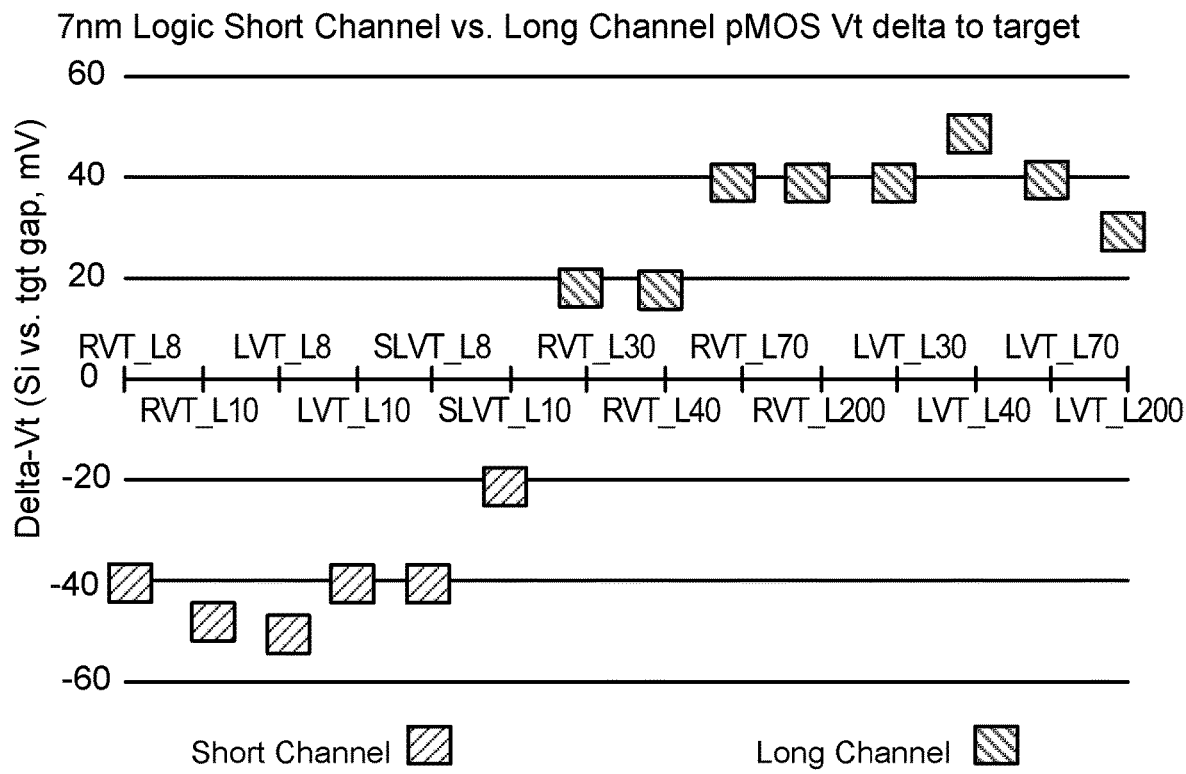
FIG. 1 is a chart illustrating conventional short channel vs. long channel Vt differences to a target value.

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage, or mode of operation.

The terminology used herein describes particular aspects only and should not be construed to limit any aspects disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Further, various aspects may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequences of actions described herein can be considered to be embodied entirely within any form of non-transitory computer-readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to" and/or other structural components configured to perform the described action.

Further, It should be noted that the terms "connected," "coupled," or any variant thereof, mean any connection or coupling, either direct or indirect, between elements, and can encompass a presence of an intermediate element between two elements that are "connected" or "coupled" together via the intermediate element. It should also be understood that "coupled" or "connected" as used herein mean electrically coupled or electrically connected unless stated otherwise.

As indicated above, disadvantages of the conventional circuit designs include the inability to adjust for a desired Vt for both the short channel transistors and long channel transistors. FIG. 1 illustrates a conventional short channel vs. long channel Vt differences to a target value. It will be appreciated that conventional FinFET manufacturing technologies cannot meet the target Vts for both short channel transistors (which may be used for logic circuits) and long channel transistors (which may be used for analog/radio frequency (RF) circuits), using conventional Vt tuning techniques (e.g., adjusting Well, Halo and/ or work function (WF)). FIG. 1 illustrates this result for the 7 nanometer node technology with a short channel and long channel. X-axis is the devices with different Vt type and gate length. For example, RVT_L8 indicates the Vt type is regular voltage threshold (RVT), gate length=8 nm; LVT_L200 indicates the Vt type is LVT low voltage threshold (LVT), gate length=200 nm; and SLVT_L8 indicates the Vt type is super low voltage threshold (SVLT), gate length=8 nm. As illustrated in the example, in 7 nanometer technology (7 nm), Vt at the opposite sides of a pMOS design yielded short channel (SC) having Vt~30-50 mV below target and a long channel (LC) having a Vt~20-50 mV above target. Conventional Vt tuning techniques move Vt in the same direction, so to address the SC devices by increasing the Vt would cause the LC devices to move further away from the target Vt. Accordingly, the conventional Vt tuning techniques provide no solution to meet Vt for analog circuits using long channel transistors.

Figure 2:
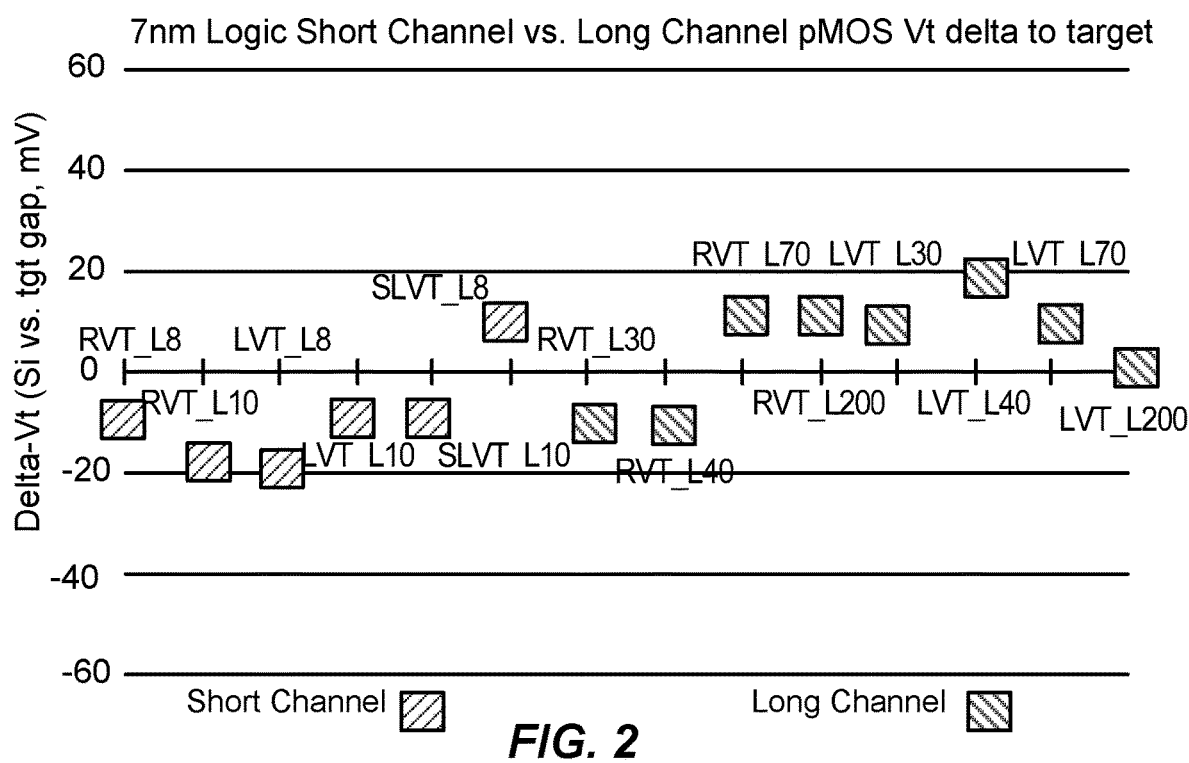
FIG. 2 is a chart illustrating short channel vs. long channel Vt differences to a target value according to one or more aspects of the disclosure.

FIG. 2 illustrates short channel vs. long channel Vt differences to a target value according to one or more aspects of the disclosure. Once again, the difference between a target Vt for the short channel and long channel in 7 nm technology is shown. In contrast to the deviations illustrated in FIG. 1, in FIG. 2, Vt for the pMOS design yielded a short channel (SC) design having Vt~10-20 mV below target and a long channel (LC) design having a Vt~10-20 mV above the target, which is a significant improvement over the conventional designs and within a desired range of Vt variance (e.g., −20 mV to +20 mV). Details of the FinFET design according to various aspects of the disclosure will be described in the following paragraphs after a brief introduction to conventional designs.

Figure 3:
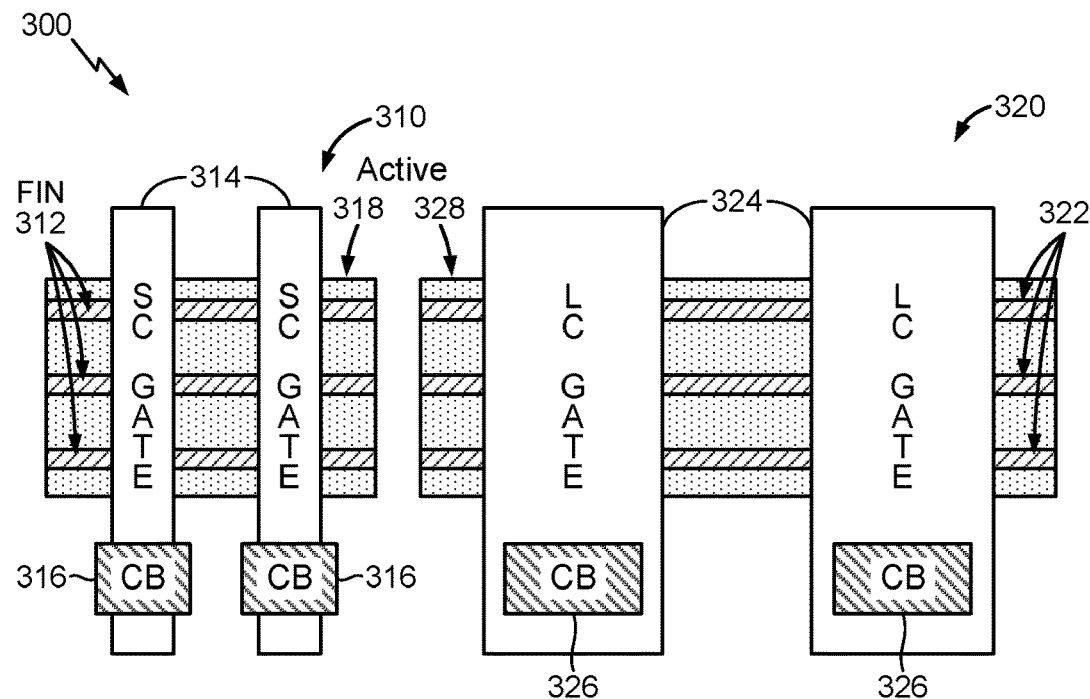
FIG. 3 is an illustration of conventional FinFETs.

FIG. 3 is an illustration of conventional FinFETs semiconductor devices 300. Conventional FET devices are generally planar devices wherein the entire channel region of the device is formed parallel and slightly below the planar upper surface of the semiconducting substrate. In contrast FinFETs are considered to be 3D devices that are formed above a semiconductor substrate. As illustrated in FIG. 3, from a planar view, in the short channel (SC) devices 310, the short channel gate 314 (SC gate) overlaps the fins 312, which may be made of material similar to the substrate (e.g., silicon, not illustrated). The fins 312 may protrude from the substrate and are separated by a plurality of fin-formation trenches between the fins 312. The gate width of the SC device 310 is orthogonal to the gate length direction as illustrated by short channel gate 314. The portions of the fins 312 covered by the short channel gate 314 are the channel regions of the SC device 310. The portions of the fins 312 that are positioned outside of the short channel gate 314 are the source/drain regions and are generally consider the active area 318 of the SC device 310. Gate contact 316 is provided at one end of the short channel gate 314 that is outside the active area 318.

Likewise, as illustrated in FIG. 3, long channel (LC) devices 320, include a long channel gate 324 (LC gate) that overlaps the fins 322, which may be made of material similar to the substrate (e.g., silicon, not illustrated). The fins 322 may protrude from the substrate and are separated by a plurality of fin-formation trenches between the fins 322. The gate width of the LC device 320 is orthogonal to the gate length direction as illustrated by long channel gate 324. The portions of the fins 322 covered by the long channel gate 324 are the channel regions of the LC device 320. The portions of the fins 322 that are positioned outside of the long channel gate 324 are the source/drain regions of the LC device 320 and are generally consider the active area 328 of the LC device 320. Gate contact 326 is provided at one end of the long channel gate 324 that is outside the active area 328.

Figure 4:
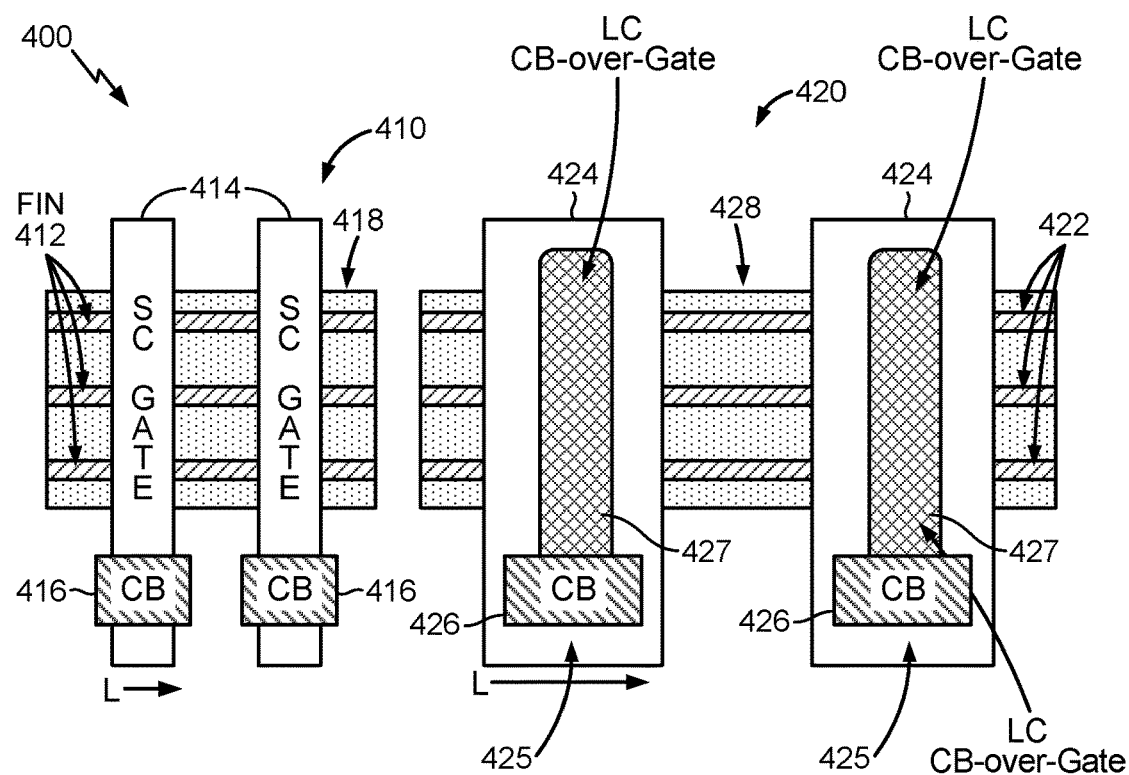
FIG. 4 is an illustration of FinFETs according to one or more aspects of the disclosure.

As noted above, FinFET devices can be formed with different channel lengths (critical dimension) and with different threshold voltages (Vt) such that the FinFET devices exhibit different characteristics that allow integrated circuits to have transistors that perform with different characteristics. For example, in some applications, integrated circuits are designed with a plurality of short channel devices and a plurality of long channel devices, such as illustrated in FIGS. 3 and 4. The critical dimension or channel length of the long channel devices is typically greater than the channel length or critical dimension of the short channel devices and a short channel device typically has a threshold voltage (Vt) that is less than the threshold voltage of a long channel device. Conversely, the off-state leakage current of a short channel device is typically greater than the off-state leakage current of a long channel device. In general, relative to the long channel devices, the short channel devices exhibit faster switching speeds and higher off-state leakage currents. Short channel devices are frequently employed in logic portions of an integrated circuit where fast switching speeds of the transistors is desired. In contrast, long channel devices can be used in circuits where the switching speed of the transistors is less important than their ability to exhibit low off-state leakage currents. For example, long channel devices may be used in analog portions, RF portions and/or for input/output circuits.

FIG. 4 is an illustration of FinFETs according to one or more aspects of the disclosure. As illustrated, from a planar view, a semiconductor device 400 may include one or more short channel (SC) FinFET devices 410 and/or one or more long channel (LC) FinFET devices 420. In the short channel (SC) FinFET device 410, the short channel gate 414 (SC gate) overlaps the fins 412, which may be made of material similar to the substrate (not illustrated). In some aspects, the substrate may be a bulk semiconductor substrate, or silicon on insulator (SOI) substrate and may be formed by at least one of silicon, germanium, silicon-germanium alloy, carbon-doped silicon, carbon-doped silicon-germanium alloy, gallium arsenide, indium phosphide, or any other conventional semiconductor substrate. The fins 412 may protrude from the substrate and are separated by a plurality of fin-formation trenches between the fins 412. The three fins 412 are provided only for illustration and more or less fins may be provided. Similarly, the two SC gates 414 are provided solely for illustration and the number of gates may be more or less. The gate width of the SC FinFET device 410 is orthogonal to the gate length direction "L" as illustrated by short channel gate 414. The portions of the fins 412 covered by the short channel gate 414 are the channel regions of the SC FinFET device 410. The portions of the fins 412 that are positioned outside of the short channel gate 414 are the source/drain regions and are generally consider the active area 418 of the SC FinFET device 410. Gate contact 416 is provided at one end of the short channel gate 414 that is outside the active area 418. It will be appreciated that SC FinFET device 410 is similar to the SC device 310.

Likewise, as illustrated in FIG. 4, a semiconductor device 400 may include long channel (LC) FinFET device 420, include a long channel gate 424 (LC gate) that overlaps the fins 422, which may be made of material similar to the substrate (e.g., silicon, not illustrated). The fins 422 may protrude from the substrate and are separated by a plurality of fin-formation trenches between the fins 422. The three fins 422 are provided only for illustration and more or less fins may be provided. Similarly, the two LC gates 424 are provided solely for illustration and the number of gates may be more or less. The gate width of the LC FinFET device 420 is orthogonal to the gate length direction as illustrated by long channel gate 424. The portions of the fins 422 covered by the long channel gate 424 are the channel regions of the LC device 420. The portions of the fins 422 that are positioned outside of the short channel gate 424 are the source/drain regions of the LC FinFET device 420 and are generally consider the active area 428 of the LC FinFET device 420. Gate contact 425 includes a gate contact base 426 is provided at one end of the long channel gate 424 that is outside the active area 428 and also includes an extended portion 427 that extends into the active area 428 (e.g., area with fins, source/drain) of the FinFET device 420.

In some aspects the extended portion 427 extends beyond the fins 422. It will be appreciated that the extended portion 427 may have different dimensions from the gate contact base 426, as the extended portion 427 has to maintain separation from the active area 428 to avoid potential shorts or excessive leakage to the active area 428. In some aspects, the gate contact base 426 may have a length (L) in the range of 30 nm to 300 nm and a thickness/height in the range of 10 nm to 50 nm. In some aspects, the extended portion 427 may have a smaller length (in "L" direction) than the gate contact base 426. For example, the extended portion 427 may be about 10 nm narrower than the gate contact base 426 in length (L). Accordingly in some aspect the extended portion may have a length in the range of 20 nm to 290 nm. In some aspects the extended portion is formed on a common centerline with the gate contact base (centered in the L direction), e.g., 5 nm narrower on each side to provide additional margin to prevent shorting, leakage, etc. However, in some aspects, the extended portion 427 may have the same length or greater length (in "L" direction) relative to the gate contact base 426. The gate contact base 426 and extended portion 427 may be formed of the same material, e.g., titanium nitride (TiN), titanium aluminum (TiAl), titanium aluminum nitride (TiAlN), aluminum, tungsten, copper or any suitable conductive material. The extended portion 427 allows for an additional tuning parameter for designers to adjust the Vt of the long channel devices, which also allows greater adjustment of conventional tuning parameters (discussed above) so both the long channel and short channel target threshold voltages can be met, as illustrated in FIG. 2. It will be appreciated that the foregoing dimensions and materials, as well as the illustrated configurations are provided merely as examples and should not be construed to limit the various aspects disclosed herein.

Accordingly, at least one aspect of the disclosure includes a semiconductor device (e.g., 400) having a plurality of fins (e.g., 422) on a substrate. A long channel gate (e.g., 424) is disposed over a first portion of the plurality of fins (e.g., 422). The semiconductor device (e.g., 400) also has a gate contact (e.g., 425) having a gate contact base (e.g., 426) and an extended portion (e.g., 427) that extends into an active area (e.g., 428) from the gate contact base (e.g., 426) outside the active area.

Further, it will be appreciated that aspects disclosed herein can be fabricated without additional costs, no impact on yield and no additional mask or process steps, as discussed in greater detail in the following paragraphs. In the following process description, like parts will be numbered the same. However, not all parts will be numbered and/or discussed in successive figures, as to avoid excessive redundancy and focus on the portions of the device that each portion of the illustrated fabrication process is related to.

FIG. 5 is an illustration of a portion of a process for forming FinFETs according to one or more aspects of the disclosure. As illustrated, a silicon (Si) substrate is effectively separated into 3 separate regions using conventional shallow trench isolation (STI) processes. For example, by using lithography techniques, optionally in combination with one or more lithography masks, designers can define the lateral size, position and shape of the substrate portions (e.g., Si substrates 510, 520 and 530). Optionally, the substrate portions may be formed in a separate patterning sequence. The separate substrate portions may be used for different applications. For example, Si substrate 510 may be used for SC logic devices and is separated from the other portions of the silicon substrate by STI portion 512. Si substrate 520 may be used for LC logic devices and is separated from the other portions of the silicon substrate by STI portion 512 and STI portion 522. Si substrate 530 may be used for LC input/output (I/O) devices and is separated from the other portions of the silicon substrate by STI portion 522. However, it will be appreciated that the illustrated substrates and design uses are merely for illustration and more or less substrate portions can be formed and the design use may be varied from the illustrated examples.

FIG. 6 is an illustration of a portion of a process for forming FinFETs according to one or more aspects of the disclosure. As illustrated, dummy gates are patterned and formed over the various Si substrate portions using conventional processes. For example, an SC dummy gate 610 is formed over Si substrate 510, a LC dummy gate 620 is formed over Si substrate 520 and a LC dummy gate 630 is formed over Si substrate 530.

FIG. 7 is an illustration of a portion of a process for forming FinFETs according to one or more aspects of the disclosure. As illustrated, insulating spacers may be applied to the gates using conventional processes. For example, insulating spacer 710 is formed on SC dummy gate 610 which is formed over Si substrate 510, insulating spacer 720 which is formed on LC dummy gate 620 is formed over Si substrate 520, and insulating spacer 730 is formed on LC dummy gate 630 which is formed over Si substrate 530. Portions 712, 714 are the source/drain regions in Si substrate 510, portions 722, 724 are the source/drain regions in Si substrate 520, and portions 732, 734 are the source/drain regions in Si substrate 530 and are formed using conventional processes.

Figure 8:
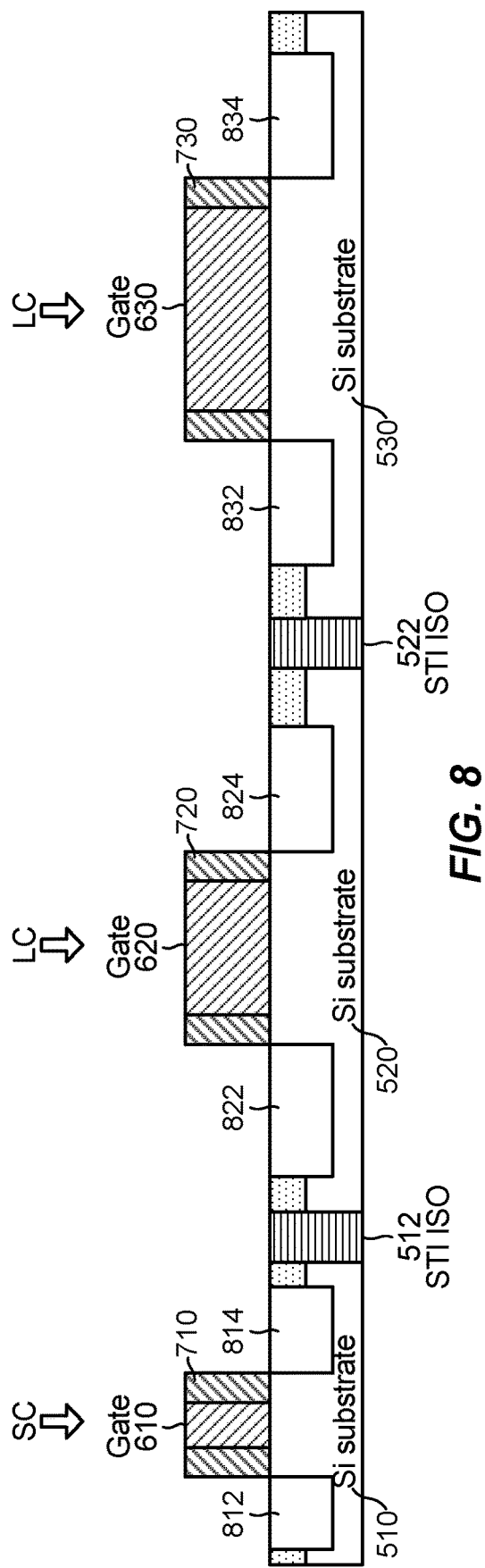
FIG. 8 is an illustration of a portion of a process for forming FinFETs according to one or more aspects of the disclosure.

FIG. 8 is an illustration of a portion of a process for forming FinFETs according to one or more aspects of the disclosure. Conventional epitaxially growth materials may be used to form source/drain regions of FinFET devices. As illustrated, source/drain epitaxial layers are grown, forming source/drain regions 812 and 814 adjacent to SC dummy gate 610 and formed over Si substrate 510, source/drain regions 822 and 824 formed adjacent to LC dummy gate 620 and formed over Si substrate 520 and source/drain regions 832 and 834 formed adjacent to LC dummy gate 630 and formed over Si substrate 530.

Figure 9:
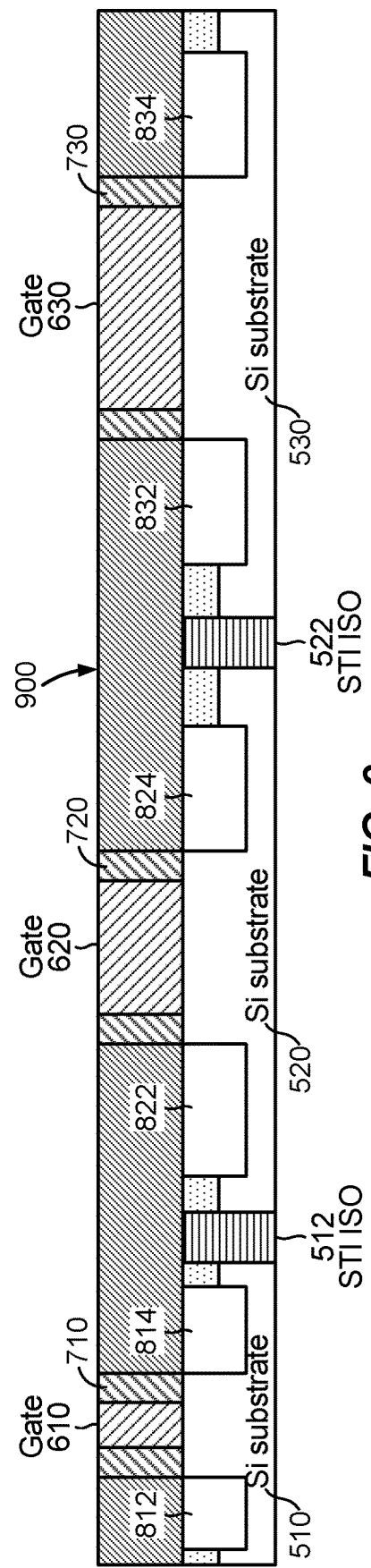
FIG. 9 is an illustration of a portion of a process for forming FinFETs according to one or more aspects of the disclosure.

FIG. 9 is an illustration of a portion of a process for forming FinFETs according to one or more aspects of the disclosure. A first dielectric layer 900 may be formed over source/drain regions 812, 814, 822, 824, 832 and 834, SC dummy gate 610, insulating spacer 710, Si substrate 510, LC dummy gate 620, insulating spacer 720, Si substrate 520, LC dummy gate 630, insulating spacer 730 and Si substrate 530. The first dielectric layer 900 may be planarized until top portions of the SC dummy gate 610, insulating spacer 710, LC dummy gate 620, insulating spacer 720, LC dummy gate 630 and insulating spacer 730 are exposed by first dielectric layer 900. A chemical mechanic polishing (CMP) may be conducted until the first dielectric layer 900 is substantially coplanar or substantially flush with the top portions as illustrated. The first dielectric layer 900 may remain above the substrate portions and source/drain regions to protect these areas during subsequent processing.

FIG. 10 is an illustration of a portion of a process for forming FinFETs according to one or more aspects of the disclosure. As illustrated, the SC dummy gate 610, LC dummy gate 620 and LC dummy gate 630 are removed using conventional techniques, such as a vertical etch process such as reactive-ion etching (RIE). Thereby voids are left within insulating spacer 710, insulating spacer 720 and insulating spacer 730 which are surrounded by first dielectric layer 900.

FIG. 11 is an illustration of a portion of a process for forming FinFETs according to one or more aspects of the disclosure. As illustrated, the void left within insulating spacers 710, 720 and 730 is filled with high-K (HK or HiK) (e.g., 1112)/metal-gate (MG) (e.g., 1114) deposition to form SC gate 1110, LC gate 1120 and LC gate 1130. The term high-K refers to a material with a high dielectric constant κ, relative to silicon dioxide. After the deposition, the gate material is planarized using CMP. After the CMP process the first dielectric layer 900 is substantially coplanar or substantially flush with the top portions of the SC gate 1110, insulating spacer 710, LC gate 1120, insulating spacer 720, LC gate 1130 and insulating spacer 730 as illustrated.

Figure 12:
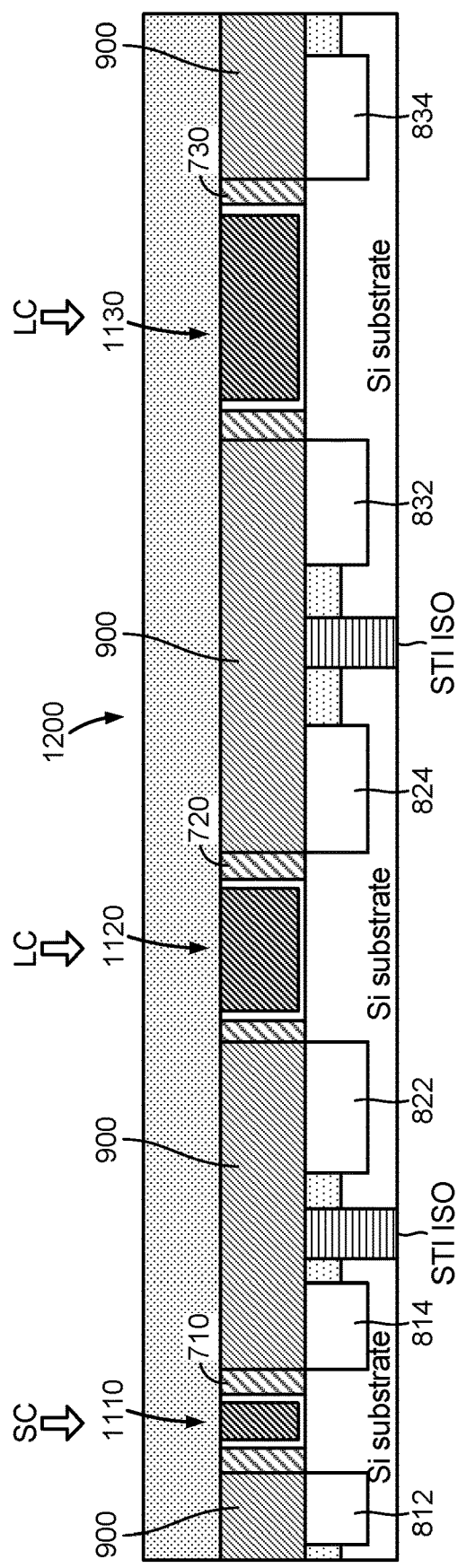
FIG. 12 is an illustration of a portion of a process for forming FinFETs according to one or more aspects of the disclosure.

FIG. 12 is an illustration of a portion of a process for forming FinFETs according to one or more aspects of the disclosure. As illustrated, a second dielectric layer 1200 may be formed over first dielectric layer 900 and the top portions of the SC gate 1110, insulating spacer 710, LC gate 1120, insulating spacer 720, LC gate 1130 and insulating spacer 730.

Figure 13:
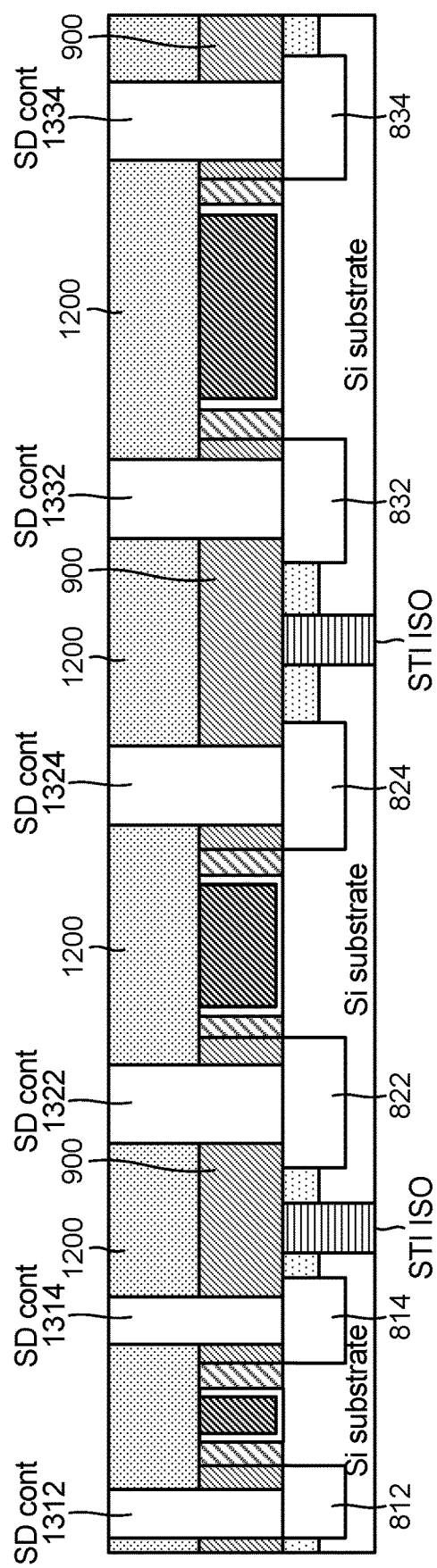
FIG. 13 is an illustration of a portion of a process for forming FinFETs according to one or more aspects of the disclosure.

FIG. 13 is an illustration of a portion of a process for forming FinFETs according to one or more aspects of the disclosure. As illustrated, source/drain contacts are formed through first dielectric layer 900 and second dielectric layer 1200. Specifically, source/drain contacts 1312, 1314, 1322, 1324, 1332 and 1334 are coupled to source/drain regions 812, 814, 822, 824, 832 and 834, respectively.

FIG. 14 is an illustration of a portion of a process for forming FinFETs according to one or more aspects of the disclosure. As illustrated, gate contacts 1410, 1420 and 1430 are formed through the second dielectric layer 1200. Specifically, gate contact 1410 is coupled to SC gate 1110 using conventional processes. However, LC gate contact 1420, which is coupled to LC gate 1120, has an extended portion that extends on top of LC gate 1120. Likewise, LC gate contact 1430, which is coupled to LC gate 1130, has an extended portion that extends on top of LC gate 1130.

FIG. 15 is an illustration of a two dimensional (2D) planar view FinFETs according to one or more aspects of the disclosure. As illustrated, the extended portion 1527 extends from the gate contact base 1526 of gate contact 1420. It will be appreciated that both the extended portion 1527 and the gate contact base 1526 of LC gate contact 1420 are formed as one structure, as illustrated in FIG. 14. Extended portion 1527 extends over the active region and at least one of the fins 1522. In some aspects, extended portion 1527 extends over all of the fins 1522. Accordingly, no additional process steps are needed to form the extended gate configuration. Likewise, the extended portion 1537 extends from the gate contact base 1536 of gate contact 1430. Extended portion 1537 extends over the active region and at least one of the fins 1532. In some aspects, extended portion 1537 extends over all of the fins 1532. It will be appreciated that both the extended portion 1537 and the gate contact base 1536 of LC gate contact 1430 are also formed as one structure, as illustrated in FIG. 14. In contrast to the extended portions of the gate contacts discussed previously, SC gate contact 1410 is formed in a conventional manner and does not have a portion that extends over fins 1512. Accordingly, aspects of the disclosure allow for improved long channel FinFET devices without impacting the short channel devices. Additionally, there various aspects disclosed require no additional process steps and therefore do not negatively impact production complexity or costs.

It will be appreciated that additional metal processing, such as separating the source/drain contacts 1312, 1314, 1322, 1324, 1332 and 1334 and coupling the gate, source and drain contacts to additional transistors and/or other elements may be performed using conventional techniques as known in the art. Further, it will be appreciated that in the foregoing description an exhaustive detailing of conventional process methods for forming FinFETs was not provided. Further, the various aspects described herein are not limited to the details provided in the foregoing fabrication process description and skilled designers may use various known processes to form semiconductor devices according to the disclosed aspects.

Figure 16:
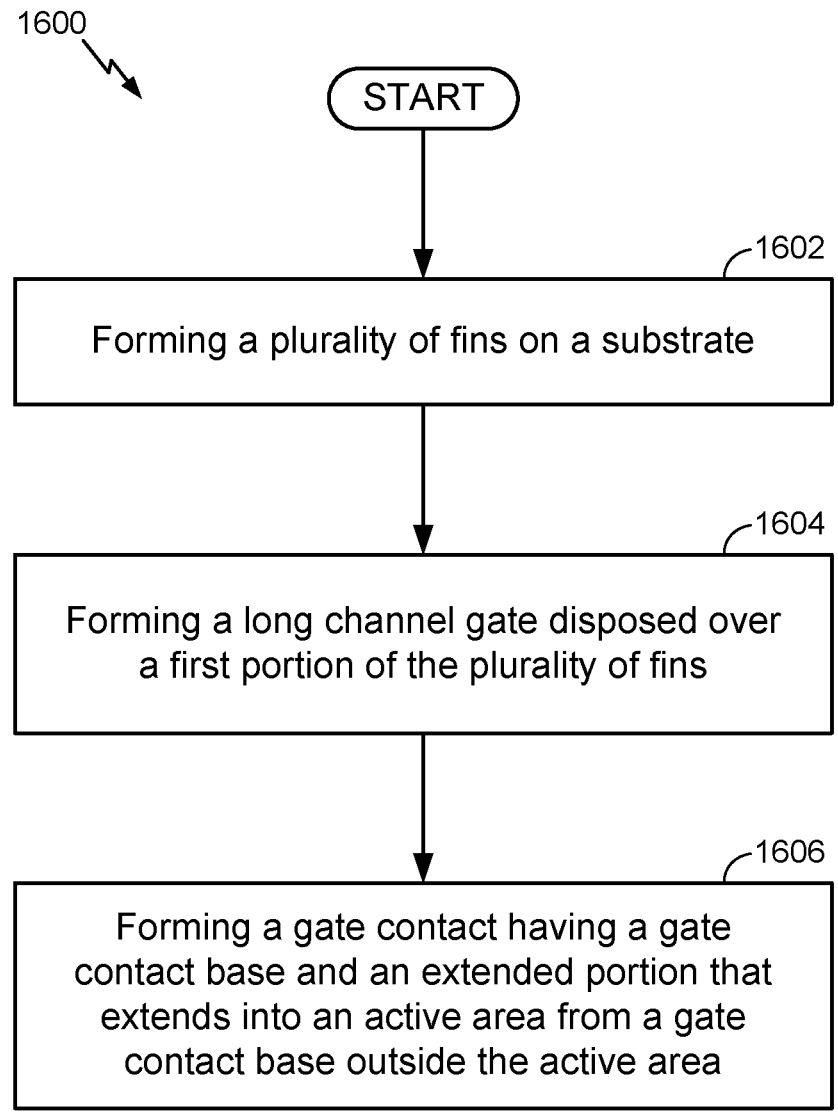
FIG. 16 illustrates a flow chart of an example method of fabricating a semiconductor device according to one or more aspects of the disclosure.

Accordingly, it will be appreciated that the various aspects disclosed herein include methods for fabricating a semiconductor device. FIG. 16 illustrates a flowchart for an exemplary method for fabricating a semiconductor device in accordance with some examples of the disclosure. As shown in FIG. 16, the method 1600 begins in block 1602 with forming a plurality of fins on a substrate. The method 1600 continues in block 1604 with forming a long channel gate disposed over a first portion of the plurality of fins. The method 1600 continues in block 1606 with forming a gate contact having a gate contact based and an extended portion that extends into an active area from the gate contact base outside the active area.

Figure 17:
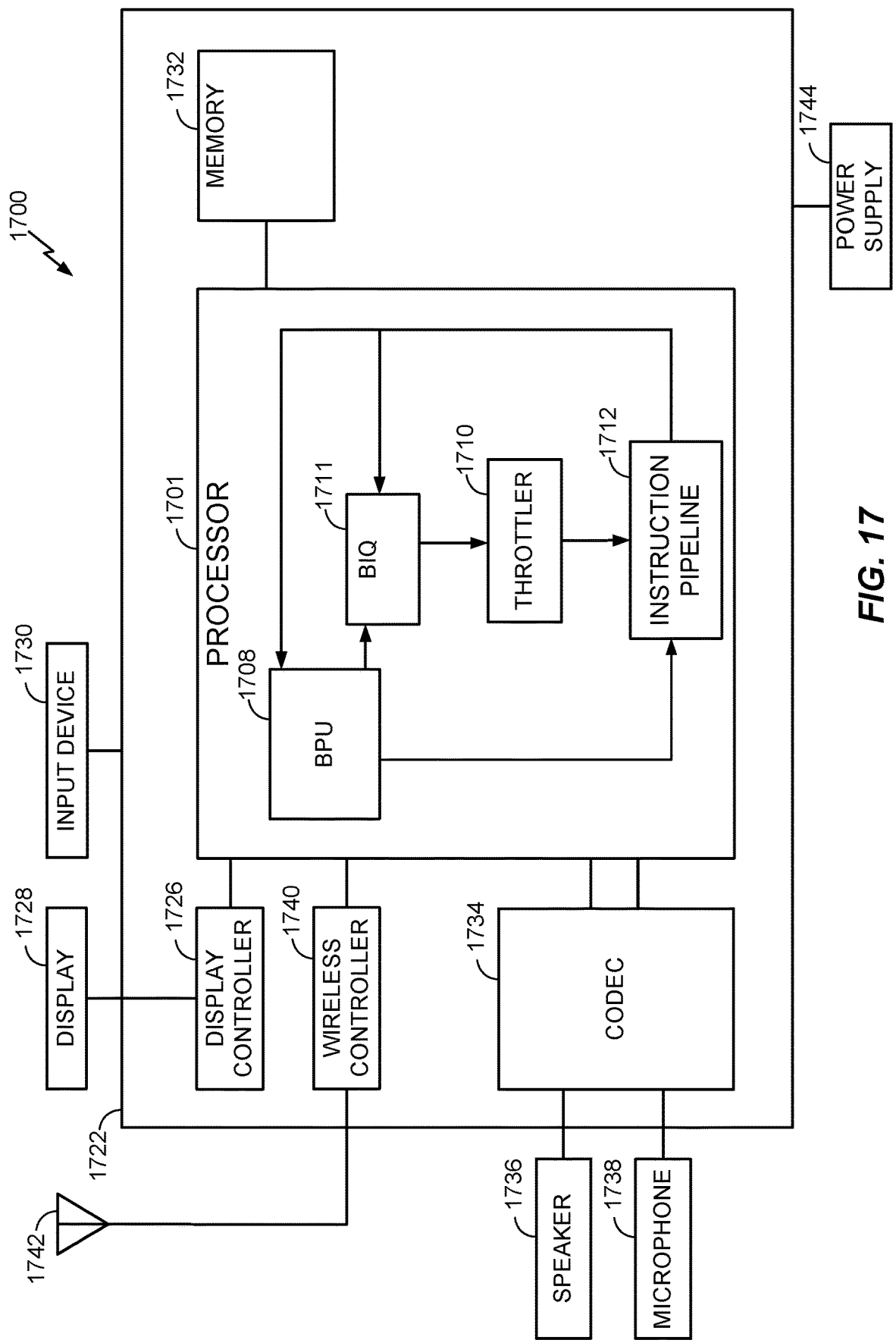
FIG. 17 illustrates example devices with aspects of the disclosure integrated therein.

FIG. 17 illustrates an exemplary mobile device in accordance with some examples of the disclosure. Referring now to FIG. 17, a block diagram of a mobile device that is configured according to exemplary aspects is depicted and generally designated 1700. In some aspects, mobile device 1700 may be configured as a wireless communication device, which may include one or more FinFET semiconductor devices (e.g., logic, memory, RF, I/O, etc.) as disclosed herein in that may be integrated into the various active devices discussed below. As shown, mobile device 1700 includes processor 1701. Processor 1701 is shown to comprise instruction pipeline 1712, buffer processing unit (BPU) 1708, branch instruction queue (BIQ) 1711, and throttler 1710 as is well known in the art. Other well-known details (e.g., counters, entries, confidence fields, weighted sum, comparator, etc.) of these blocks have been omitted from this view of processor 1701 for the sake of clarity.

Processor 1701 may be communicatively coupled to memory 1732 over a link. Mobile device 1700 also include display 1728 and display controller 1726, with display controller 1726 coupled to processor 1701 and to display 1728.

In some aspects, FIG. 17 may include coder/decoder (CODEC) 1734 (e.g., an audio and/or voice CODEC) coupled to processor 1701; speaker 1736 and microphone 1738 coupled to CODEC 1734; and wireless controller 1740 (which may include a modem) coupled to wireless antenna 1742 and to processor 1701.

In a particular aspect, where one or more of the above-mentioned blocks are present, processor 1701, display controller 1726, memory 1732, CODEC 1734, and wireless controller 1740 can be included in a system-in-package or system-on-chip device 1722. Input device 1730 (e.g., physical or virtual keyboard), power supply 1744 (e.g., battery), display 1728, input device 1730, speaker 1736, microphone 1738, wireless antenna 1742, and power supply 1744 may be external to system-on-chip device 1722 and may be coupled to a component of system-on-chip device 1722, such as an interface or a controller.

It should be noted that although FIG. 17 depicts a mobile device, processor 1701 and memory 1732 and other components, which may include one or more semiconductor devices as disclosed herein, may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 18:
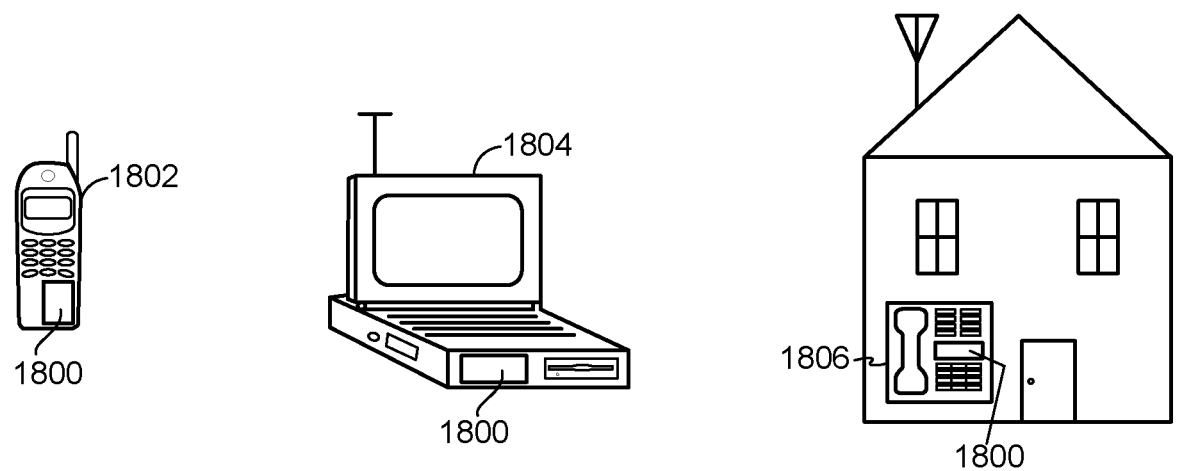
FIG. 18 illustrates additional examples of devices with aspects of the disclosure integrated therein.

FIG. 18 illustrates various electronic devices that may be integrated with any of the aforementioned integrated device, semiconductor device, integrated circuit, die, interposer, package or package-on-package (PoP) in accordance with some examples of the disclosure. For example, a mobile phone device 1802, a laptop computer device 1804, and a fixed location terminal device 1806 may include one or more semiconductor devices as disclosed herein 1800 as described herein. The integrated device 1800 may be, for example, any of the integrated circuits, dies, integrated devices, integrated device packages, integrated circuit devices, device packages, integrated circuit (IC) packages, package-on-package devices described herein. The devices 1802, 1804, 1806 illustrated in FIG. 18 are merely exemplary. Other electronic devices may also feature the integrated device 1800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles, drones, autonomous vehicles, or any other device that stores or retrieves data or computer instructions, or any combination thereof.

It will be appreciated from the foregoing disclosure that additional processes for fabricating the various aspects disclosed herein will be apparent to those skilled in the art and a literal rendition of all variations of the processes discussed above and illustrated in the included drawings is not necessary.

The foregoing disclosed devices and functionalities, e.g., as described in reference to any one or more of FIGS. 4-18 may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor dies and packaged into a semiconductor chip. The chips are then may be employed in devices as described above.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, embodiments disclosed herein can include a non-transitory computer-readable media embodying a method for fabricating the one or more semiconductor devices, as disclosed herein. Accordingly, the disclosure is not limited to the illustrated examples as any means for performing the fabrication processes described herein are contemplated by the present disclosure.

While the foregoing disclosure shows various illustrative embodiments, it should be noted that various changes and modifications could be made herein without departing from the scope of the teachings of the present disclosure as defined by the appended claims. The various materials identified for example and illustration may be substituted by known equivalent or alternative materials. The example fabrication processes discussed above may have various process operations combined or split into additional process operations. Additionally, the processes, functions, steps and/or actions described in the method claims in accordance with the embodiments of the disclosure described herein need not be performed in any particular order, unless specifically describe as requiring a particular order or if it is necessary as being dependent on the previous process. Furthermore, although elements of the present disclosure may be described or claimed in the singular, the plural is contemplated unless limitation to the singular is explicitly stated.

What is claimed is:

1. A semiconductor device, comprising:
    a plurality of fins on a substrate and extending in a first direction;
    a long channel device having a long channel gate disposed over a first portion of the plurality of fins, wherein the long channel gate is disposed over a first portion of the plurality of fins on a first portion of the substrate;
    a gate contact comprising a gate contact base and an extended portion that extends into an active area from the gate contact base outside the active area,
        wherein the long channel gate is active and longer than the gate contact in the first direction and in a second direction different from the first direction such that an entirety of the gate contact is formed on the long channel gate, and
        wherein the extended portion has a smaller length than the gate contact base in the first direction;
    a short channel device having a short channel gate disposed over a second portion of the plurality of fins on a second portion of the substrate; and
    a second gate contact outside a second active area of the second portion of the plurality of fins, wherein the short channel gate is active,
        wherein the extended portion allows for an additional tuning parameter to adjust a threshold voltage of the long channel device such that the threshold voltage of the long channel device is adjusted to be within about 10 to 20 mV above a target threshold voltage while a threshold voltage of the short channel device is within about 10 to 20 mV below the target threshold voltage.

2. The semiconductor device of claim 1, wherein the extended portion extends over at least one of the plurality of fins.

3. The semiconductor device of claim 1, wherein the extended portion extends over the plurality of fins.

4. The semiconductor device of claim 1, further comprising:
    another long channel gate disposed over a third portion of the plurality of fins on a third portion of the substrate; and
    a third gate contact comprising another gate contact base and another extended portion that extends into a third active area of the third portion of the plurality of fins from the another gate contact base outside the third active area,
    wherein the another long channel gate is active and longer than the third gate contact in the first direction and in the second direction such that an entirety of the third gate contact is formed on the another long channel gate.

5. The semiconductor device of claim 4, wherein the first portion of the substrate, the second portion of the substrate and the third portion of the substrate are isolated from each other by one or more shallow trench isolation (STI) areas.

6. The semiconductor device of claim 5, wherein the first portion and the third portion of the substrate are configured for analog circuits and/or radio frequency circuits and the second portion of substrate is configured for logic circuits.

7. The semiconductor device of claim 1, wherein the substrate is a bulk semiconductor substrate.

8. The semiconductor device of claim 1, wherein the substrate is a silicon on insulator substrate.

9. The semiconductor device of claim 1, wherein the substrate comprises at least one of silicon, germanium, silicon-germanium alloy, carbon-doped silicon, carbon-doped silicon-germanium alloy, gallium arsenide or indium phosphide.

10. The semiconductor device of claim 1, wherein the extended portion and the gate contact base are made of a same material.

11. The semiconductor device of claim 10, wherein the same material is at least one of titanium nitride, titanium aluminum nitride, titanium aluminum, aluminum, copper or tungsten.

12. The semiconductor device of claim 1, wherein the gate contact base has a length in a range of 30 nm to 300 nm in the first direction.

13. The semiconductor device of claim 12, wherein the gate contact base has a height in a range of 10 nm to 50 nm.

14. The semiconductor device of claim 12, wherein the extended portion has a length that is approximately 10 nm smaller than the length of the gate contact base in the first direction.

15. The semiconductor device of claim 14, wherein the extended portion has a common centerline with the gate contact base.

16. The semiconductor device of claim 1, wherein the extended portion has a length in a range of 20 nm to 290 nm in the first direction.

17. The semiconductor device of claim 1, wherein the semiconductor device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a component in an automotive vehicle.

* * * * *